United States Patent
Mathur et al.

(10) Patent No.: US 7,392,349 B1
(45) Date of Patent: Jun. 24, 2008

(54) TABLE MANAGEMENT WITHIN A POLICY-BASED ROUTING SYSTEM

(75) Inventors: Harish Mathur, San Jose, CA (US); Sanjay Sreenath, Santa Clara, CA (US)

(73) Assignee: NetLogic Microsystems, Inc., Mt. View, CA (US)

( * ) Notice: Subject to any disclaimer, the term of this patent is extended or adjusted under 35 U.S.C. 154(b) by 389 days.

(21) Appl. No.: 11/045,575

(22) Filed: Jan. 26, 2005

Related U.S. Application Data (60) Provisional application No. 60/539,693, filed on Jan. 27, 2004.

(51) Int. Cl.
*G06F 12/08* (2006.01)
*G06F 12/14* (2006.01)
*G06F 12/10* (2006.01)

(52) U.S. Cl. .................. 711/141; 711/108; 711/128

(58) Field of Classification Search ........................ None
See application file for complete search history.

(56) References Cited

U.S. PATENT DOCUMENTS

| 6,289,414 B1 | 9/2001 | Feldmeier et al. |
| 6,378,042 B1 * | 4/2002 | Henderson et al. .......... 711/128 |
| 2004/0083337 A1 * | 4/2004 | Husby ........................ 711/108 |

* cited by examiner

*Primary Examiner*—Hyung Sough
*Assistant Examiner*—Duc T Doan
(74) *Attorney, Agent, or Firm*—Shemwell Mahamedi LLP (57) ABSTRACT

A method of controlling a content addressable memory (CAM) device. A data structure is generated that specifies (i) a prioritized set of rules and (ii) storage locations within the CAM device for one or more match clauses of each of the rules. A new rule having a specified priority is recorded in the data structure. Candidate storage locations within the CAM device are identified within the CAM device for the match clauses of each of the rules having a lower priority than the new rule. The candidate storage locations are compared with the storage locations specified by the data structure. Each match clause for which the candidate storage location does not match the specified storage location is stored in the CAM device.

17 Claims, 8 Drawing Sheets

TABLE MANAGEMENT WITHIN A POLICY-BASED ROUTING SYSTEM

CROSS-REFERENCE TO RELATED APPLICATIONS

This application claims priority from, and hereby incorporates by reference, U.S. Provisional Application No. 60/539,693, filed Jan. 27, 2004 and entitled "Table Management Within a Packet Classification System."

TECHNICAL FIELD

The present invention relates generally to the field of communications, and more particularly to traffic routing and switching in a network communication system.

BACKGROUND

Routers are devices that direct traffic in a network. Each router in the network has a route table that typically includes routing information to enable incoming packets to be forwarded or routed to their destination in the network. Some routers forward packets based only on the destination address indicated in the packet. Other, more complex, routers forward or route packets based on policies defined, for example, by a network administrator. The latter routing schemes are commonly referred to as policy-based routing.

Policy-based routing can enable packets to be forwarded or routed in a network based on any number of criteria, including the source of the packet, the destination of the packet, the cost of forwarding the packet through different routes or paths in the network, or the bandwidth available on different routes in the network. Policy-based routing can also be used to provide a certain Quality of Service (QoS) or Type of Service (ToS) to differentiated traffic in the network. For example, one or more of the various fields (e.g., the ToS bits) in the header of an Internet Protocol (IP) packet can be used by policy-based routers to forward IP packets in a network.

Each policy-based router implements a policy through the use of route maps that define how to forward the packet in the network. Each route map statement or policy statement is referred to herein as a rule and contains one or more match clauses and a set clause. The match clauses are a series of conditions that are used to determine if an incoming packet satisfies a particular rule. If the rule is satisfied, the set clause specifies how the router should forward the packet in the network. If none of the match clauses of a given rule is satisfied, the policy-based router investigates lower priority rules.

A content addressable memory (CAM) may be used within a policy-based router to determine whether an incoming packet matches a rule. In a typical implementation, each rule is converted to one or more match clauses that are stored within respective entries in the CAM. When an incoming packet is received, it is processed by control circuitry within the router (e.g., typically a host processor and/or network processor) to determine the policy field information. The policy field information, in turn, is provided to the CAM as a policy search key. For each match clause in the CAM that matches the policy search key, a corresponding match signal is asserted, thereby enabling the host processor to determine if a given rule is satisfied.

Entries stored within a CAM are often prioritized according to storage location. For example, in a conventional CAM, entries stored at lower-numbered addresses are typically deemed to have a higher priority than entries stored at higher-numbered addresses. This presents challenges in policy-based routers, as it is often necessary to insert new rules having intermediate priorities (or higher priorities) relative to previously stored rules. For example, if a CAM device contains N rules having priorities ranging from a highest priority (0) to a lowest priority (N−1), and a new rule having a higher priority than the existing rules is to be stored, then each of the existing N rules is deleted from its current location and stored again at a lower priority location to make room for the new rule to be stored in the highest priority location. Such operation tends to be time consuming and inefficient both for the control circuitry within the router (e.g., typically a host processor and/or network processor) and the CAM.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. The term "exemplary" is used to express an example, and not a preference or requirement.

In embodiments of the present invention, rule insertion within a policy-based routing system is performed by evaluating a rule database to identify rules that will be displaced by the inserted rule, and selectively allocating storage locations within the CAM device to the match clauses of the inserted rule and the displaced rules. In one embodiment, the inserted rule is allocated the higher priority one of two CAM addresses: a CAM address from a prioritized list of unoccupied CAM addresses referred to herein as a free address list, or an address from a prioritized list of addresses currently occupied by match clauses of displaced rules referred to herein as a recycled address list. The current CAM address of each match clause of each displaced rule is compared with the next address to be allocated from the recycled address list. If the current CAM address of the match clause does not match the recycled address, then the match clause is flagged for relocation and is allocated either the recycled address or an address from the free address list, whichever has higher priority. By selectively allocating addresses from the free address list to match clauses of the inserted rule and displaced rules, unoccupied locations within the CAM may be filled where appropriate to reduce the number of match clauses of displaced rules which are flagged for relocation, thereby potentially reducing the number of CAM write operations required to input the match clauses of the new rule into the CAM device. In CAM devices in which write operations share resources otherwise needed for search operations (e.g., one or more shared buses or shared resources within the CAM device), reducing the number of write operations required to input the match clauses of the new rule may prevent or at least reduce disruption of search operations, enabling a higher average search rate within the switching or routing system.

Figure 1:
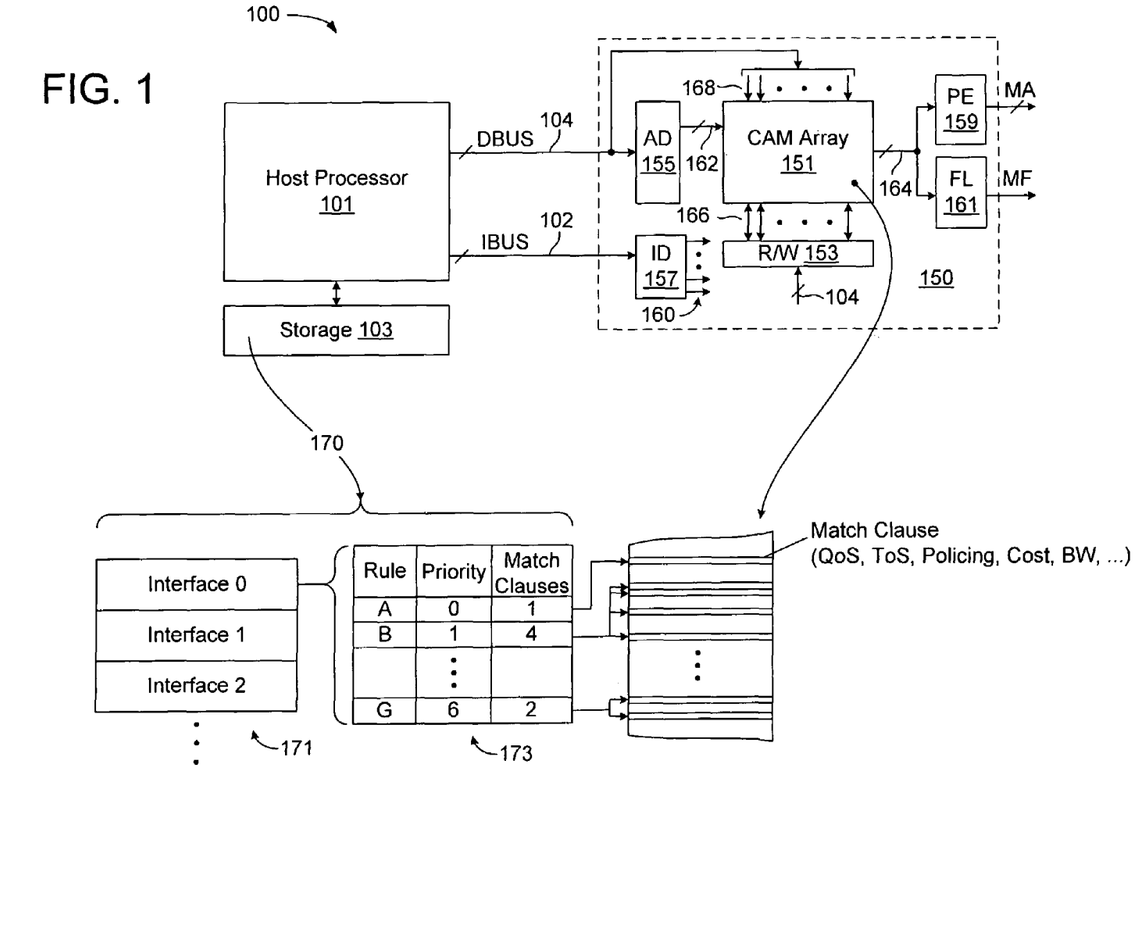
FIG. 1 illustrates an interrelation between interfaces, rule data databases and content addressable memory (CAM) entries in an exemplary packet routing system in which embodiments of the invention may be used.

FIG. 1 illustrates an exemplary network switching system 100 in which embodiments of the invention may be used. The switching system 100 may be a network switch or router, or any other device for classifying and/or forwarding traffic in a communications network. The switching system 100 includes a host processor 101, host storage 103 and CAM device 150, and may further include other components not shown (e.g., associated memory for storing set clauses or other associated data values, line cards having ingress and egress ports to enable receipt and transmission of data packets, switch fabric for transferring packets between ingress and egress ports in response to destination or policy information output by the associated storage, etc.). In one embodiment, the host processor 101 is implemented by two distinct processors: a control processor and a network processor which may share the host storage 103 and interface to the CAM device 150 or have dedicated storage and/or CAM interfaces.

In general, the control processor is responsible for configuring and controlling resources within the switching system 100, and the network processor is responsible for managing data flow between ingress and egress ports of the switching system. More specifically, the control processor configures and maintains a searchable database within the CAM 150 and corresponding associated data values (e.g., set clauses) within the associated memory (not shown in FIG. 1), while the network processor issues search commands to the CAM device 150 and performs packet forwarding and/or classification operations based on values output from the associated memory. In one embodiment, the control processor is a general purpose processor that executes stored program code (e.g., stored in storage 103 or another memory component of the processing system) to carry out the configuration and maintenance operations required to operate the switching system 100. A special purpose processor, application-specific integrated circuit (ASIC) or other type of control device may alternatively be used to implement the control processor. Similarly, in one embodiment, the network processor is implemented by a network processing unit (NPU) that executes stored program code (e.g., stored in storage 103) to enable data flow operations within the switching system 100. In alternative embodiments, a general purpose processor, ASIC or other type of control device may be used to implement the network processor. Also, the functions performed by the control processor and network processor may alternatively be performed by a single host processor. Whether embodied by multiple processors or a single processor, the processing entity that performs the functions of the control processor and network processor is referred to collectively herein as the host processor.

The CAM device 150 may be implemented in a dedicated integrated circuit (IC) device or as a portion of an IC device (or IC package) that includes other circuit blocks or features, such as the control processor and/or network processor described above. The CAM device 150 includes a binary or ternary CAM array 151, read/write circuit 153, address decoder 155, instruction decoder 157, priority encoder 159 and flag logic 161. A number of other circuit blocks, not shown, may also be included within the CAM device 150 including, without limitation, input/output circuitry, global masking circuitry, registers (e.g., for storing search keys, status information, search results, etc.), configuration circuitry, integrated associated storage, error checking and correction circuitry, and so forth. Also, while a single CAM array 151 is shown, the CAM device 150 may include multiple CAM arrays 151 and associated circuitry.

Instructions such as read, write and search instructions are issued to the CAM device 150 by the host processor via an instruction bus 102. The instruction decoder 157 decodes incoming instructions and responsively issues signals 160 to other circuit blocks within the CAM device 150 as necessary to carry out the instructed operation. In the case of read and write instructions, the host device may additionally issue address values to the CAM device 150 via data bus 104 to specify storage locations to be accessed in the ternary CAM array 151, with read data and write data also being transferred between the CAM device 150 and the host device via data bus 104. In the case of search instructions, the host device may additionally issue search keys to the CAM device via data bus 104 or via a dedicated search key bus. In the embodiment of FIG. 1, search results, including a match flag (MF) and match address (MA), are returned to the host processor (e.g., via a result bus, not shown) and may additionally, or alternatively, be provided to an associated storage (not shown) or other device. In alternative embodiments, any one or more of the instruction bus, data bus and result bus may be eliminated and the signals carried thereon multiplexed onto another of the buses. Also, rather than multiplexing address and data onto the data bus 104, a dedicated address bus may be provided.

The CAM array 151 is populated with binary or ternary CAM cells arranged in rows and columns. Precharged match lines are coupled to respective rows of the CAM cells, and bit lines 166 and compare lines 168 are coupled to respective columns of the CAM cells. Together, the bit lines 166 form a data port for read/write access to address-selected rows of CAM cells within the CAM array 151, and the compare lines 168 form a compare port for inputting search keys to the CAM array 151 during search operations. The CAM cells themselves are specialized store-and-compare circuits each having at least one storage circuit to store a bit of a CAM entry (a data bit) and a compare circuit for affecting the state of a match line according to whether the stored bit matches an incoming search bit. In the case of a ternary CAM array, an additional storage circuit may be provided to store a mask bit for selectively masking the search result within the CAM cell. Also, the data bit and mask bit may be stored within a ternary CAM cell in an encoded form (e.g., X-Y encoded) rather than as distinct bits.

In one embodiment, the compare circuits within the CAM cells of a given row are coupled in parallel to the match line for the row, with each compare circuit switchably forming a discharge path to discharge the match line if the search result is unmasked (e.g., mask bit set to zero) and if the stored data bit does not match the search bit (i.e., the data bit has a different state than the search bit). By this arrangement if any unmasked bit of a CAM word does not match the corresponding bit of the search key, the match line for the row is discharged to signal the mismatch condition. If each bit of the CAM word is either masked or matches the corresponding bits of the search key, the match line remains in its precharged state to signal a match. Because a search key is presented to all the rows of ternary CAM cells in each compare operation, a rapid, parallel search for a matching ternary CAM word is performed.

Still referring to FIG. 1, the match lines 164 are provided to the priority encoder 159 and flag logic 161. During a search operation, the priority encoder 159 generates a match address (MA) according to the state of the match lines and a predetermined prioritizing policy. In embodiments discussed below, the prioritizing policy is fixed by design such that matches at lower numbered addresses within the CAM array 151 take priority over matches at higher numbered addresses. In alternative embodiments, matches at higher numbered addresses within the CAM may take priority over matches at lower numbered addresses. The flag logic 161 generates a match flag (MF) that indicates, for a given search operation, whether a match has been detected (e.g., ORing or otherwise logically combining the states of the match lines), and may additionally generate a multiple match flag to indicate that two or more matches have been detected. During write operations, the priority encoder 159 and flag logic 161 may be used to generate, based on validity bits or encoded values stored or associated with each row of CAM cells, a next free address (NFA) that indicates a highest-priority unoccupied storage location within the CAM array 151 and one or more flags that indicate whether the CAM array 151 is full or almost full.

During a read or write operation within the CAM device 150, the address decoder 155 receives an address via the data bus 104 (or from an address source within the CAM device 150) and activates a corresponding one of word lines 162 to access a row of CAM cells. In a read operation, each of the CAM cells within the accessed row outputs the bits of the stored bit pair onto the bit lines 166, thereby enabling the CAM word to be read out via the data port (i.e., amplified by sense amplifier circuitry within the read/write circuit 153 and output onto the data bus 104). Conversely, in a write operation, write driver circuitry within the read/write circuit 103 outputs a write data value onto the bit lines 166 to store an entry within the accessed row of CAM cells. In one embodiment, two pairs of bit lines are provided to each column of CAM cells to enable the corresponding bit pair of a ternary CAM word (i.e., mask bit and data bit, or encoded bit pair) to be read or written in a single access operation. In an alternative embodiment, a single pair of bit lines may be provided per CAM cell column to enable time-multiplexed access to the ternary CAM word (i.e., bits of a given bit pair transferred one after the other). In such an embodiment, two word lines 162 may be provided for each row of CAM cells, one to enable access to a first bit (e.g., a data bit) and the other to enable access to a second bit (e.g., a mask bit) within each CAM cell of the row. In another alternative embodiment, the bit lines may be omitted altogether, and the compare lines used in time-multiplexed fashion for either read/write access or search key delivery.

Still referring to FIG. 1, a rule database 170 that defines a number of routing interfaces 171 and corresponding rule maps 173 within the switching system 100 is maintained within the storage 103 of the host processor and used to manage the insertion and deletion of entries within the CAM device 150. In the particular embodiment shown, each rule map 173 within the rule database 170 defines a set of rules for a logical or physical routing interface, with each rule corresponding to one or more match clauses stored at respective locations within the CAM array 151. For example, the rule map for interface 0 includes seven rules, A-G, ordered by priority (e.g., rule A having the highest priority (0) and rule G the lowest priority (6)), with each rule corresponding to a specified number of match clauses (e.g., rule A corresponding to a single match clause, rule B corresponding to four match clauses and so forth). Each of the match clauses within a given rule corresponds to a respective entry within the CAM array and may specify various match criteria including, without limitation, one or more quality-of-service (QoS) criteria, type of service (ToS) criteria, policing criteria, cost-of-use criteria, bandwidth criteria and so forth.

Figure 2:
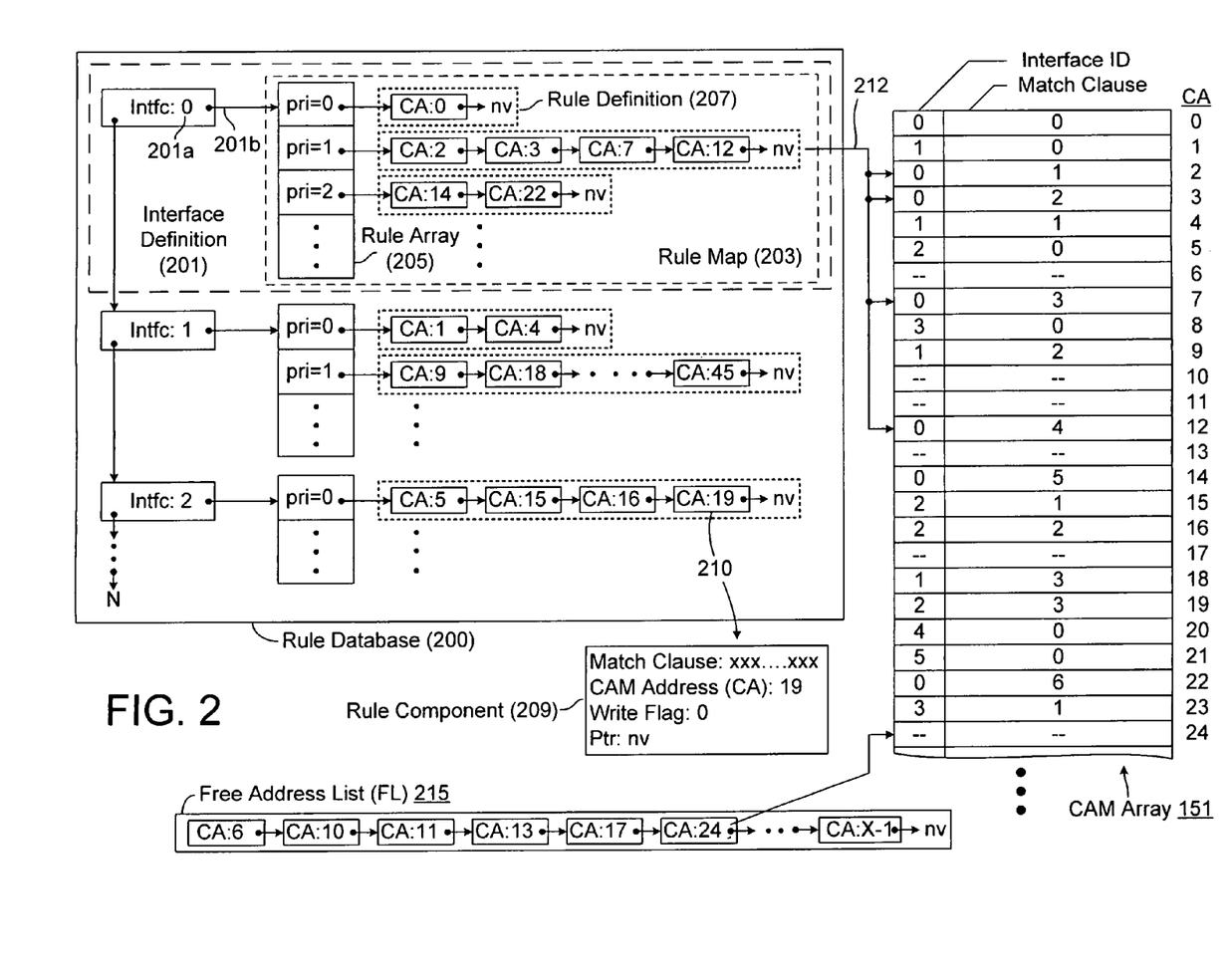
FIG. 2 illustrates an exemplary rule database and free address list, and their relationship to storage locations within a CAM array.

FIG. 2 illustrates a more detailed embodiment of a rule database 200 and corresponding match clauses within a CAM array 151. As shown, the rule database 200 is formed by a linked list of interface definitions, with each interface definition including an interface identifier (e.g., a numeric or logical identifier, 201a) and a pointer (201b) to a rule map 203. In one embodiment, the rule map 203 itself includes an array of rule pointers referred to herein as a rule array 205, though a linked list of rule pointers may alternatively be used. Each of the rule pointers points to a respective rule definition 207 (a "rule"), formed by a linked list of elements referred to herein as rule components 209. As shown in detail view 210, each of the rule components 209 includes a match clause (or value from which a match clause may, in whole or part, be derived), a CAM address (CA) at which the match clause is stored or is to be stored (also referred to as an entry handle), a write flag which, when set, indicates that the match clause is to be written to the CAM array at the CAM address, and a pointer (Ptr) to point to the next rule component in the rule or, if the last rule component in the rule, to a null value ("nv").

In the embodiment of FIG. 2, the priority of each rule in the rule map 203 established implicitly by the position of the corresponding rule pointer within the rule array 205. Thus, the rule pointer at the top of the rule array 205 points to the highest priority rule (e.g., priority=0 rule), and the non-null rule pointer at the bottom of the rule array 205 points to the lowest priority rule. The rule priority may alternatively be specified as a separate data value within each rule array element. Similarly, each rule array element may include a value indicating the number of rule components in the corresponding rule. That is, the rule array 205 may be an array of data structures each including a rule pointer, priority value and/or count of rule components.

Still referring to FIG. 2, match clauses that correspond to the rule components 209 are stored within the CAM array 151 at the CAM address specified within the rule component (e.g., as shown, for example, by the line 212 extending from interface 0, rule 1 to CAM addresses 2, 3, 7 and 12) along with an interface identifier that specifies the interface to which the match clause belongs. By this arrangement, the CAM array 151 may be logically partitioned among multiple interfaces, with host-generated search keys having interface fields that match only the interface field of the interface desired to be searched. Because the interfaces are partitioned logically, rather than physically, match clauses for the various interfaces may be interspersed within the CAM array 151 (e.g., in the portion of the CAM array shown, match clauses 0-6 of interface 0 are interspersed with match clauses 0-3 of interface 1, match clauses 0-3 of interface 2 and so forth), enabling more efficient use of the available storage space than if a predetermined amount of the CAM array 151 were allocated to each interface. In an alternative embodiment, physical partitioning of the CAM array 151 between interfaces may be used instead of or in addition to the logical partitioning shown.

When a rule is deleted from the rule database, the corresponding match clauses within the CAM array 151 are invalidated or otherwise deleted, yielding unoccupied storage locations within the CAM array 151 that are interspersed with valid entries. Such unoccupied storage locations, which may also be present due to as-yet unused space within the CAM array 151, are illustrated in FIG. 2 by the notation '--' as, for example, in the case of CAM address locations 6, 10, 11, 17 and 24. In one embodiment, the host processor maintains a linked list of such unoccupied storage locations ordered by their priority within the CAM device. The linked list is referred to herein as a free address list (FL) and is shown by example in FIG. 2 at 215. Other data structures may be used to maintain the free address list in alternative embodiments (e.g., one or more bit vectors). As discussed above, priority is assumed to be inversely proportional to the numeric value of the CAM address (i.e., lower-numbered CAM addresses are higher priority than higher-numbered CAM addresses) in the CAM array 151 of FIG. 2 and other Figures described herein, though priority may be directly proportional to the numeric value of the CAM address in alternative embodiments.

Figure 3:
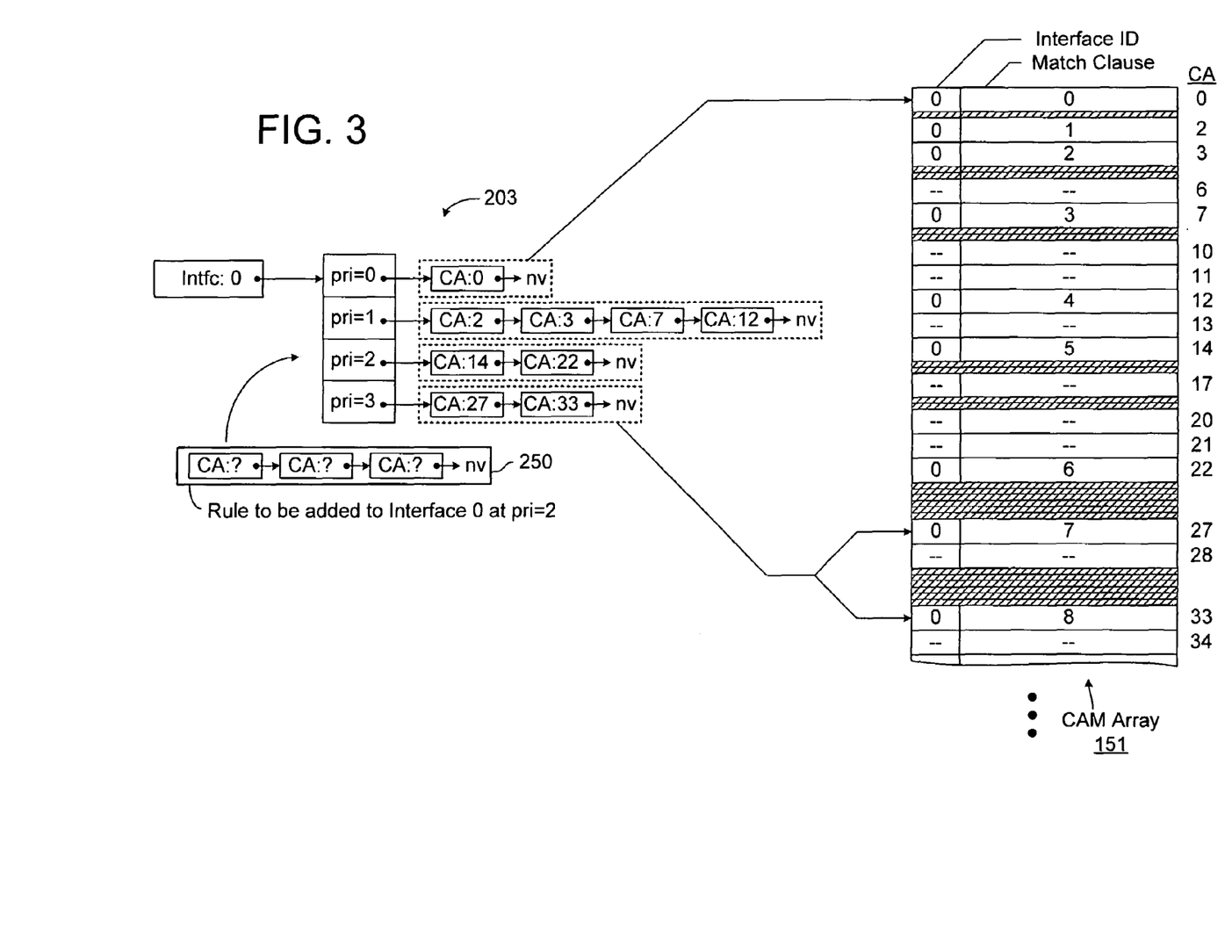
FIG. 3 illustrates a proposed rule insertion within a rule map from the rule database of FIG. 2.

FIG. 3 illustrates a three-component rule 250 to be inserted with priority of two into the rule map 203 of interface zero, and the status of the CAM array 151 prior to the rule insertion. For purposes of example, the rule map 203 is shown in its entirety as including four rules having priorities 0-3 (more or fewer rules may be included) so that, when the new rule 250 is inserted at priority 2, the existing rules having priority 2 and 3 are reassigned to priorities 3 and 4. Thus, rules in the rule map 203 that have priorities equal to or below the priority of the new rule 250 are deemed to have lower priority than the new rule 250 and are displaced to incrementally lower priority values. Such rules are accordingly referred to herein as displaced rules.

Figure 4:
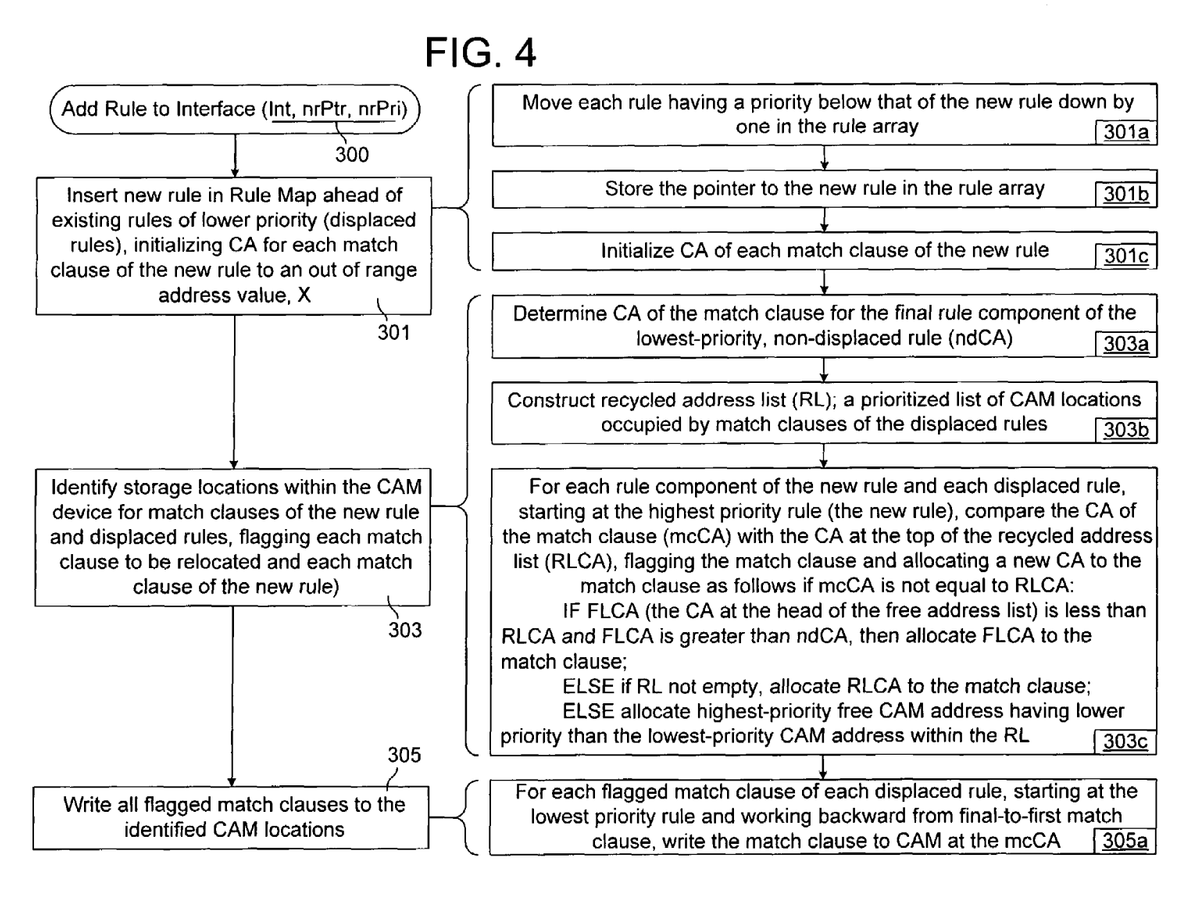
FIG. 4 illustrates an exemplary method of inserting a new rule within the rule map of FIG. 3 and writing match clauses that correspond to the new rule and relocated match clauses from displaced rules to the CAM device.
Figure 5:
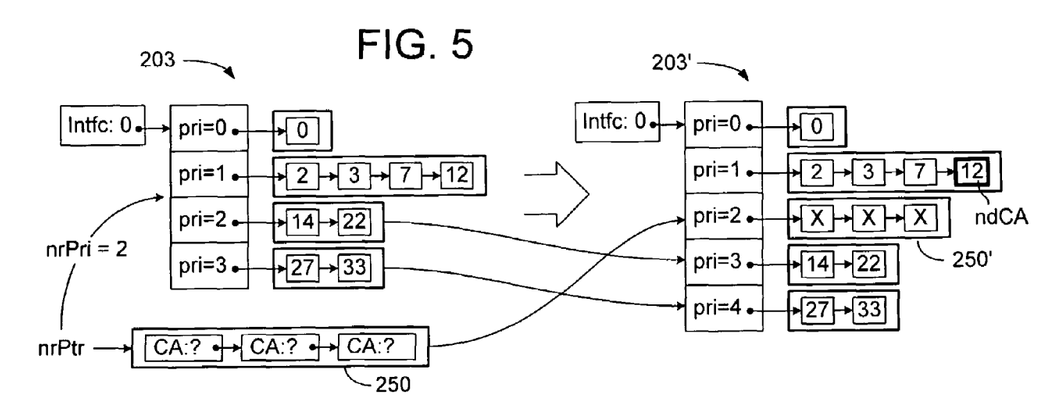
FIG. 5 illustrates the result of the rule insertion operation described in reference to FIG. 4.

FIG. 4 illustrates a method for inserting a rule into the rule database 200 of FIG. 2 and for storing corresponding match clauses within a CAM array according to an embodiment of the invention. The interface receiving the new rule, the new rule itself, and the priority of the new rule are specified by a system administrator or other actor (which may be an automated process) and are shown at 300 as "Int" (Interface ID), "nrPtr" (pointer to rule definition of new rule) and "nrPri" (new rule priority). At 301, the new rule is inserted into the rule map ahead of existing rules of lower priority, with the CAM address of each rule component of the new rule being initialized to an out-of-range address value, X. Referring to detail blocks 301a, 301b, 301c, the new rule may be inserted into the rule map by moving each rule having a priority below that of the new rule (including the current rule at the new rule priority) down by one in the rule array as shown at 301a (i.e., displacing the lower priority ruled), storing the pointer to the new rule in the rule array at the array index indicated by the new rule priority (i.e., RuleArray[nrPri]:=nrPtr, where ':=' denotes assignment) as shown at 301b, and initializing the CAM address for the match clause within each new rule component to 'X' as shown at 301c. The rule insertion and rule displacement that results from these operations is illustrated in FIG. 5. That is, the new rule 250 is inserted into the rule map 203 yielding rule map 203' having rule 250' at priority two.

At block 303 of FIG. 4, candidate storage locations within the CAM device are identified for the match clauses of the new rule and the displaced rules, with the write flag being set for the match clauses of the displaced rules that are to be relocated and for the match clauses of the new rule. Referring to detail blocks 303a-303c, for example, the CAM address allocated to the final match clause of the lowest-priority non-displaced rule (ndCA) is determined at 303a, a prioritized list of CAM addresses occupied by match clauses of displaced rules, referred to herein as a recycled address list, is generated at 303b. At 303c, the CAM address for the match clause within each rule component of the new rule and each displaced rule, mcCA, is compared with the CAM address at the head of the recycled address list (RLCA). If the CAM address for the match clause does not match the CAM address at the head of the recycled address list (i.e., mcCA< >RLCA), the write flag is set within the rule component and a new CAM address is allocated to the match clause from either the free address list or the recycled address list. In one embodiment, shown at block 303c, the CAM address at the head of the free address list, FLCA, is allocated to the flagged match clause if (1) FLCA is greater than the CAM address allocated to the final match clause of the lowest-priority non-displaced rule, ndCA (thereby avoiding allocation of an out-of-order address to the flagged match clause) and (2) FLCA is less than RLCA, the address at the head of the recycled address list. Otherwise, if the recycled address list is not empty (each allocation of an address from either the recycled address list or the free address list reduces the available pool of addresses by one and establishes a new head-of-list value), RLCA is allocated to the flagged match clause. Finally, if the recycled address list is empty, then the highest priority unoccupied CAM address having a lower priority than the last CAM address allocated from the recycled address list is allocated to the match clause.

Figure 6:
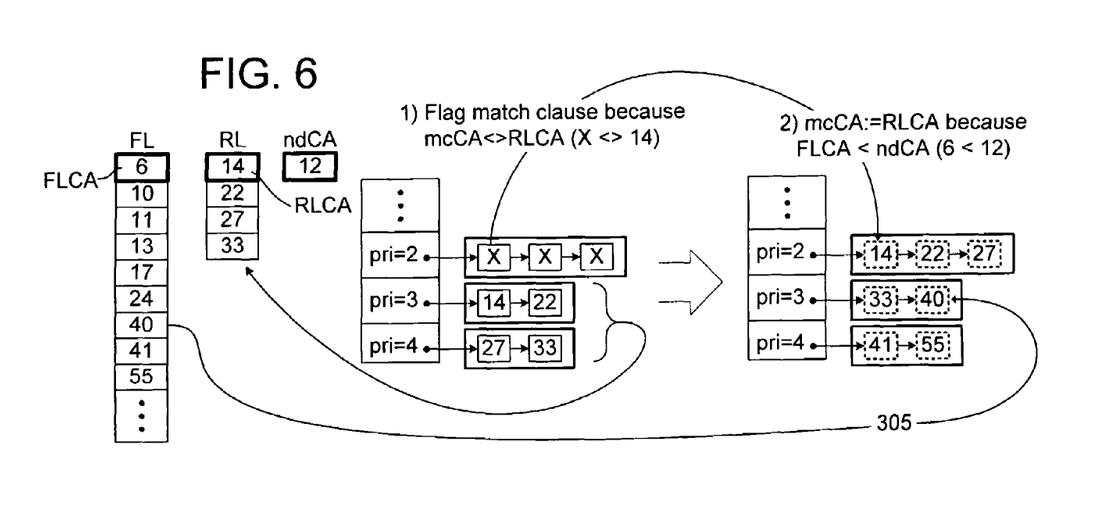
FIG. 6 illustrates allocation of CAM addresses to match clauses of the new rule and displaced rules in accordance with the method of FIG. 4.

FIG. 6 illustrates the operations described in reference to blocks 303a-303c of FIG. 4. First, the CAM address allocated to the final match clause of the lowest-priority non-displaced rule, ndCA, may be determined by traversing the linked list of rule components at RuleArray[nrPri-1], thus determining an ndCA of 12 as shown in FIG. 5 and FIG. 6. The free address list, FL, has been redrawn without pointers between linked list elements in FIG. 6 and contains a head-of-list value of 6 (i.e., FLCA=6). The recycled address list, RL, may be constructed by traversing the list of rule components for each displaced rule, in order of priority, thus contains a head-of-list value of 14 (i.e., RLCA=14) followed by address values 22, 27 and 33; the CAM addresses occupied by the match clauses of the displaced rules. It should be note that, in an alternative embodiment, the recycled address list may be established by advancing a pointer down the lists of rule components for the displaced rules rather than allocating additional storage for copies of those same CAM address values. Following the operation described in reference to FIG. 4 at 303c, the CAM address recorded within the first rule component of the new rule is compared with RLCA, the value at the head of the recycled address list. Because the recorded CAM address, mcCA, has been initialized to an out-of-range value (X), mcCA does not match RLCA (i.e., X< >14) so that the write flag within the rule component is set to flag the corresponding match clause. Also, because FLCA is less than ndCA (6<12), a new CAM address is allocated to the flagged match clause from the recycled address list rather than from the free address list. That is, RLCA is allocated to the flagged match clause as indicated by the assignment operation, mcCA:=RLCA, shown in FIG. 6. The flagged status of the match clause is illustrated in FIG. 6 by the dashed box around the CAM address.

Continuing with the subsequent rule components of the new rule and then the displaced rules, in each case the currently assigned CAM address, mcCA does not match the value at the head of the recycled address list so that the match clause is flagged. Also, FLCA remains less than the ndCA so that addresses are allocated in order from the recycled address list until the recycled address list is empty. Thus, in the example shown, CAM addresses 22 and 27 are allocated from the recycled address list to the final two match clauses of the new rule, and CAM address 33 is allocated to the first match clause (i.e., match clause of the first rule component) of the highest-priority displaced rule (i.e., the match clause of the first rule component of the rule at priority 3). After the recycled address list is empty (i.e., all CAM address 33 allocated), the free address list is traversed to establish a below-the-top pointer to the highest-priority free CAM address having a lower priority than the final CAM address allocated from the recycled address list. In this example, the final CAM address allocated from the recycled address list was 33, so that the below-the-top pointer points to free address list element containing CAM address 40. The free CAM address indicated by the below-the-top pointer is allocated to the final match clause of the highest priority rule as shown in FIG. 6 at 305, thus removing the element containing CA=40 from the free address list, and advancing the below-the-top pointer to the element in the free address list containing CAM address 41. This operation is repeated for the remaining rule components of the displaced rules, resulting in allocation of free CAM addresses 41 and 55 to the rule components of the lowest priority rule.

Reflecting on the operation shown at FIG. 6, it should be noted that in an alternative embodiment, the CAM addresses for the rule components of the new rule need not be initialized to an out-of-range value if the comparison between the recorded CAM address and the RLCA (i.e., value at the head of the recycled address list is skipped). That is, write flags are set within the rule components of the new rule and new CAM addresses are allocated to the match clauses of the new rule (i.e., from either the free address list or the recycled address list) without first checking for inequality between mcCA and RLCA.

Figure 7:
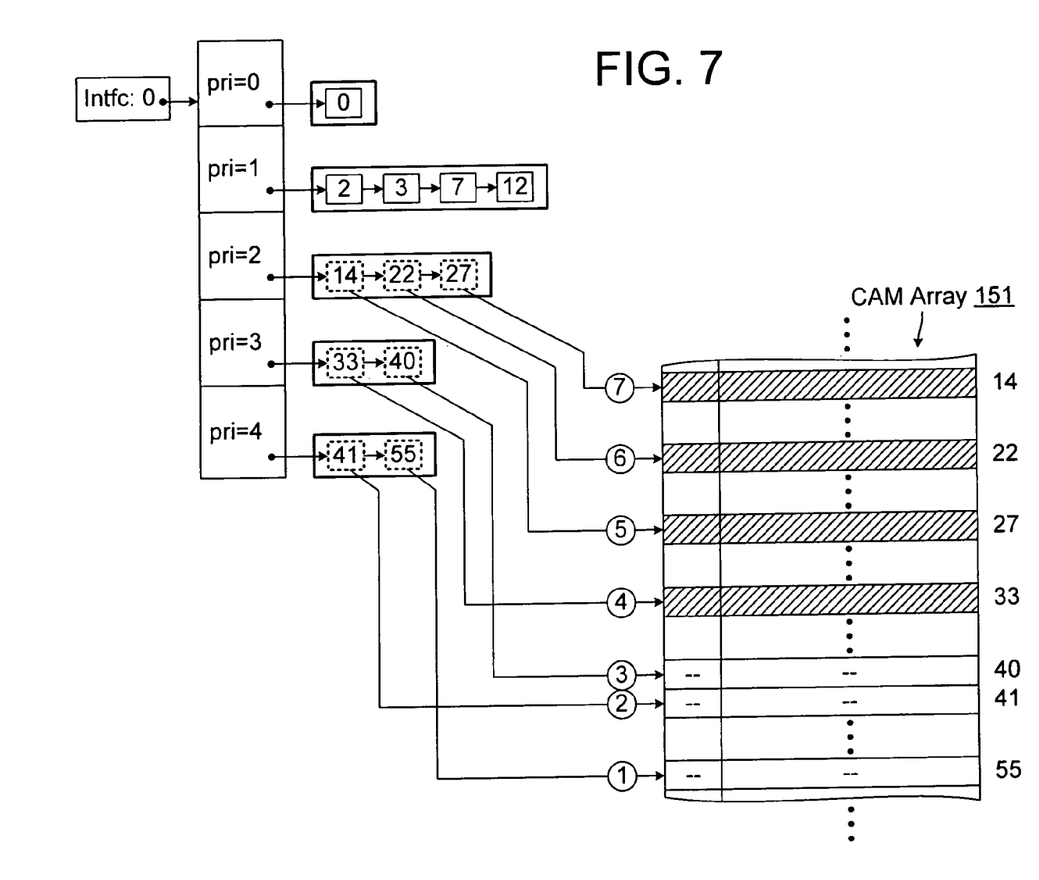
FIG. 7 illustrates writing match clauses that correspond to the new rule and relocated match clauses of displaced rules to the CAM device in accordance with the method of FIG. 4.

Returning to FIG. 4, after identifying CAM addresses for each of the match clauses of the new rule and displaced rules at 303, at block 305 each of the flagged match clauses is written to the identified CAM address. In one embodiment, shown at block 305a, this operation is performed by storing each flagged match clause of each rule component in the CAM address allocated in the preceding operation (i.e., 303c), in order of ascending priority from the lowest priority rule to the new rule and, within each rule, from final rule component to first rule component. Thus, as shown in FIG. 7, the match clause of the final rule component of the lowest-priority rule (priority=4) is written to CAM address 55 in a first CAM write operation, followed by writing the match clause of the first rule component of the lowest-priority rule to CAM address 45, then progressing from the final-to-first rule components of next-lowest-priority rule (priority=3) and writing the flagged match clauses for those rule components to CAM address 40 and 33, in that order, and then completing the operation by writing the match clauses of the new rule components to addresses 27, 22 and 14, in that order. The order of the write operations is indicated in FIG. 7 by the circled numbers, 1-7. Note that the match clauses for the non-displaced rules are not flagged, and therefore are not rewritten, but rather remain at the CAM addresses they occupied prior to the rule insertion operation. The flagged match clauses may be written to their respective CAM addresses in different order in alternative embodiments.

Figure 8:
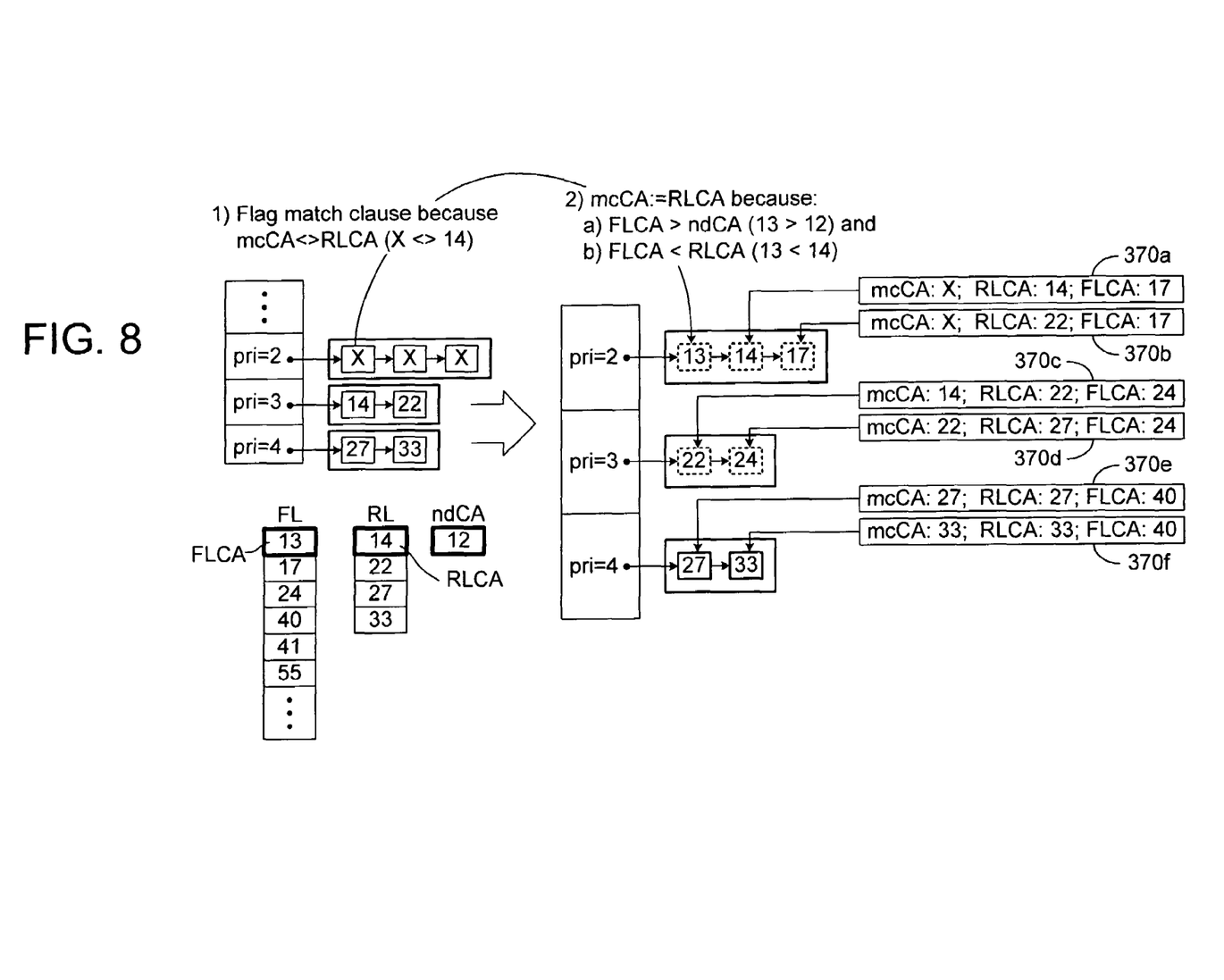
FIG. 8 illustrates another allocation of CAM addresses to match clauses of a new rule and displaced rules in accordance with the method of FIG. 4.

FIG. 8 illustrates application of the operation of FIG. 4, block 303c in a circumstance in which the CAM address at the head of the free address list is not less than the lowest-priority CAM address occupied by a non-displaced rule (i.e., FLCA>ndCA). More specifically, CAM address value 13 is present at the head of the free address list so that, upon determining that the CAM address recorded in the first component of the new rule does not match the CAM address at the head of the recycled address list, RLCA (and flagging the match clause), the CAM address at the head of the free address list, FLCA is compared with RLCA, found to be lower, and therefore allocated to the match clause. At this point, prior to allocation of a CAM address to the second rule component of the new rule, the mcCA, RLCA and FLCA values are X, 14 and 17, respectively, as shown at 370a. Accordingly, the match clause for the second rule component of the new rule is flagged (mcCA< >RLCA), then allocated the CAM address at the head of the recycled address list, RLCA (i.e., 14), because RLCA is less than FLCA. Upon progressing to the final rule component of the new rule, mcCA is X, RLCA is 22 and FLCA is 17, as shown at 370b. Accordingly, the match clause for the final rule component of the new rule is flagged, then allocated the CAM address at the head of the free address list, FLCA (i.e., 17), because FLCA is less than RLCA. Thereafter, the conditions shown at 370c, result in RLCA (22) being allocated to the first rule component of the priority 3 rule, and the conditions shown at 370d result in FLCA (24) being allocated to the final rule component of the priority 3 rule. Progressing to the first rule component of the lowest priority rule, the recorded CAM address, mcCA, is 27 as shown at 370e and therefore matches RLCA, the value at the head of the recycled address list. Accordingly, the match clause for the rule component is not flagged (i.e., the write flag is left in the reset condition or is reset) and no new CAM address is allocated. The recorded CAM address similarly matches RLCA for the final rule component of the lowest priority rule as shown at 370f, so that the match clause for the final rule component also is not flagged nor allocated a new CAM address. The non-flagged status of the match clauses for the lowest-priority rule is indicated in FIG. 8 by the solid box around the CAM addresses 27 and 33.

Figure 9:
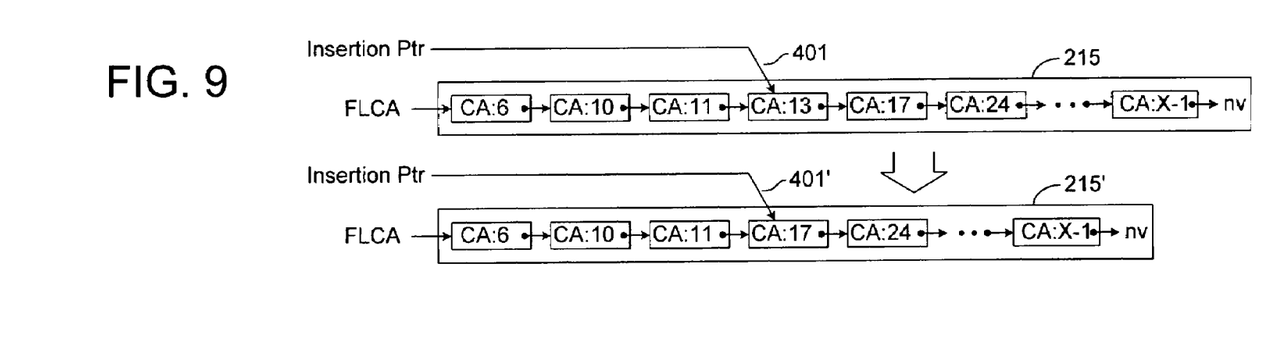
FIG. 9 illustrates an alternative manner of allocating CAM addresses to match clauses of new and displaced rules.

Reflecting on the rule insertion example of FIG. 8, it can seen that the allocation of three CAM addresses from the free address list enabled the new rule to be inserted with fewer CAM write operations than in the rule insertion example of FIG. 6 (i.e., five write operations instead of seven). Further, the primary difference in the two examples is that the CAM address at the head of the free address list in the FIG. 6 has a higher priority than a CAM address occupied by a match clause of a non-displaced rule. That is, allocating the address at the head of the free address list in the example of FIG. 6 would result in an out-of-order match clause storage within the CAM array. On the other hand, it is generally desirable to allocate CAM addresses from the free address list where such allocation may result in a reduced number of CAM write operations for a given rule insertion. In one embodiment, illustrated in FIG. 9, an alternate list pointer, referred to herein as an insertion pointer 401, is established for the free address list 215 and, at the start of the operation described in reference to FIG. 4, block 303, is pointed at the highest priority free CAM address that has a lower priority than the lowest priority CAM address allocated to a non-displaced rule. That is, upon determining the CAM address of the match clause for the final rule component the lowest-priority non-displaced rule (ndCA) at block 303a of FIG. 4, the insertion pointer 401 is advanced through the free address list 215, starting at the head-of-list value, until a CAM address having a lower priority than ndCA is reached. In the example of FIG. 9 (which corresponds to the arrangement shown in FIG. 6), the insertion pointer 401 is advanced until the CAM address of 13 is reached. Thereafter, the CAM address indicated by the insertion pointer 401 is used instead of the FLCA for the address comparison and allocation operations described in reference to block 303c of FIG. 4. For example, after allocating the CAM address at the insertion pointer to the match clause for the first rule component of the new rule (i.e., allocating CAM address 13 as shown in FIG. 8), the list element pointed to by the insertion pointer is removed from the free address list 250 to yield the modified free address list shown at 215' and the insertion pointer is advanced to the next list element as shown at 401'. Through this operation, the allocation of CAM addresses shown in FIG. 8 may be achieved despite the presence of address values 6, 10, and 11 at the top of the free address list.

Figure 10:
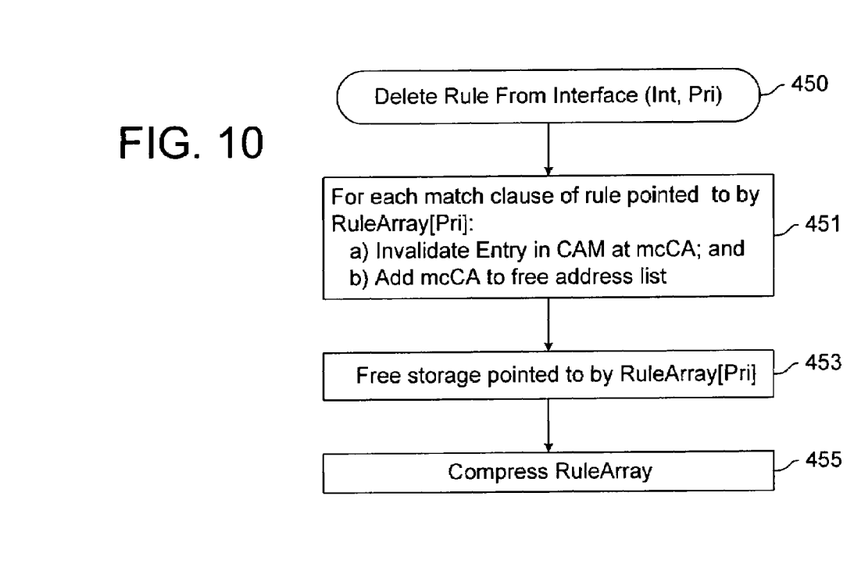
FIG. 10 illustrates an exemplary method of deleting a rule from a rule database.

FIG. 10 illustrates a rule deletion operation 450 that may be executed to remove a rule having a specified priority (Pri) from a specified interface (Int). At 451, the list of rule components pointed to by the rule array (i.e., RuleArray[Pri]) is traversed to identify the CAM addresses occupied by the rule's match clauses. For each identified CAM address, an invalidate instruction is issued to the CAM device to invalidate the corresponding CAM entry (e.g., by clearing or setting an invalid bit or by writing a predetermined invalid-code or other value into the addressed storage location), and the freed CAM address is restored to the free address list. At 453, the storage occupied by the list of rule components for the rule being deleted is freed, at block 455, the rule array is compressed, shifting up each non-null element of the rule array having a lower priority than the deleted rule.

In embodiments of the invention, the above-described techniques may be carried out, at least in part, by computer system having a processing entity and a system memory. The processing entity may include one or more processors (e.g., general-purpose processors and/or special-purposes processors such as a network processor), and the system memory may include any number of component memories including, without limitation, volatile and/or non-volatile memories. The processing entity (e.g., one or more processors) executes one or more sequences of one or more instructions stored in the system memory to perform the operations described above. In alternative embodiments, hard-wired circuitry may be used in place of or in combination with the programmed processing entity to implement the invention. Thus, embodiments of the invention are not limited to any specific combination of hardware circuitry and software.

The instructions executed by the processing entity to perform the operations described above may be transferred to the system memory from a computer-readable medium. A computer-readable medium may take many forms, including but not limited to, non-volatile media, volatile media, and transmission media. Non-volatile media may include, for example, optical or magnetic media (e.g., disks) and/or non-volatile semiconductor memory (e.g., flash memory or battery-backed memory). Transmission media includes coaxial cables, copper wire and fiber optics, including the wires that comprise bus 502. Transmission media can also take the form of acoustic or light waves, such as those generated during radio-wave and infra-red data communications.

Although the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A method of controlling a content addressable memory (CAM) device:

generating a data structure that specifies (i) a prioritized set of rules and (ii) addresses within the CAM device for one or more match clauses of each of the rules;

recording a new rule having a specified priority in the data structure;

identifying candidate addresses within the CAM device for the one or more match clauses of each of the rules having a lower priority than the new rule;

comparing the candidate addresses with the addresses specified by the data structure;

storing, in the CAM device, each of the match clauses for which the candidate address does not match the address specified by the data structure; and wherein identifying candidate addresses for the match clauses of each of the rules having a lower priority than the new rule comprises allocating respective CAM addresses to the match clauses, including obtaining each of the CAM addresses from either (i) a list of CAM addresses that correspond to unoccupied storage locations within the CAM device or (ii) a record of CAM addresses that correspond to storage locations already occupied by the match clauses of the rules having a lower priority than the new rule.

2. The method of claim 1 wherein generating the data structure comprises executing programmed instructions in a host processor, including instructions to write the data structure to a memory device coupled to the host processor.

3. The method of claim 2 wherein the memory device is distinct from the CAM device.

4. The method of claim 1 wherein the data structure comprises a list of rules ordered by priority and wherein recording a new rule having a specified priority in the data structure comprises inserting the new rule into the list of rules ahead of rules of lower priority.

5. The method of claim 1 wherein obtaining each of the CAM addresses comprises comparing a CAM address from the list of CAM addresses with a CAM address from the record of CAM addresses to determine which of the CAM addresses has a higher priority.

6. The method of claim 5 wherein allocating respective CAM addresses to the match clauses comprises, for each of the match clauses, allocating either the CAM address from the list of CAM addresses or the CAM address from the record of CAM addresses according to which of the CAM addresses has the higher priority.

7. The method of claim 1 further comprising constructing the record of CAM addresses that correspond to occupied storage locations based on the data structure.

8. The method of claim 1 wherein the data structure comprises the record of CAM addresses that correspond to occupied storage locations.

9. The method of claim 1 further comprising identifying a respective candidate storage location for each match clause of the new rule.

10. The method of claim 9 further comprising writing each match clause of the new rule to the CAM device at its respective candidate storage location.

11. The method of claim 1 wherein storing, in the CAM device, each match clause for which the candidate storage location does not match the specified storage location comprises writing each such match clause to the CAM device at its respective candidate storage location.

12. The method of claim 11 wherein writing each such match clause to the CAM device comprises writing each such match clause of the lowest priority rule before writing any such match clause of a rule having a higher priority than the lowest priority rule.

13. A system comprising:
a content addressable memory (CAM) device;
a storage device to store a data structure that specifies (i) a prioritized set of rules and (ii) addresses within the CAM device for one or more match clauses of each of the rules; and
a host processor coupled to the CAM device and the storage device, the host processor being programmed with one or more sequences of instructions which, when executed by the host processor, cause the host processor to:
record a new rule having a specified priority in the data structure;
identify candidate addresses within the CAM device for the one or more match clauses of each of the rules having a lower priority than the new rule;
compare the candidate addresses with the storage addresses specified by the data structure; and
store, in the CAM device, each match clause for which the candidate address does not match the specified address; and
wherein the instructions which cause the host processor to identify candidate storage locations for the match clauses of each of the rules having a lower priority than the new rule comprise instructions which, when executed by the host processor, cause the host processor to allocate respective CAM addresses to the match clauses, including obtaining each of the CAM addresses from either (i) a list of CAM addresses that correspond to unoccupied storage locations within the CAM device or (ii) a record of CAM addresses that correspond to storage locations already occupied by the match clauses of the rules having a lower priority than the new rule.

14. The system of claim 13 wherein the instructions which cause the host processor to obtain each of the CAM addresses comprise instructions which, when executed by the host processor, cause the host processor to compare a CAM address from the list of CAM addresses with a CAM address from the record of CAM addresses to determine which of the CAM addresses has a higher priority.

15. The system of claim 14 wherein the instructions which cause the processor to allocate respective CAM addresses to the match clauses comprise instructions which, when executed by the host processor, cause the host processor to allocate, for each of the match clauses, either the CAM address from the list of CAM addresses or the CAM address from the record of CAM addresses according to which of the CAM addresses has the higher priority.

16. A computer-readable storage medium carrying one or more sequences of instructions which, when executed by a processing entity, causes the processing entity to:
generate a data structure that specifies (i) a prioritized set of rules and (ii) addresses within the CAM device for one or more match clauses of each of the rules;
record a new rule having a specified priority in the data structure;
identify candidate addresses within the CAM device for the one or more match clauses of each of the rules having a lower priority than the new rule;
compare the candidate storage addresses with the addresses specified by the data structure;
store, in the CAM device, each match clause for which the candidate address does not match the specified address; and
wherein the instructions which cause the processing entity to identify candidate storage locations for the match clauses of each of the rules having a lower priority than the new rule comprise instructions which, when executed by the processing entity, cause the processing entity to allocate respective CAM addresses to the match clauses, including obtaining each of the CAM addresses from either (i) a list of CAM addresses that correspond to unoccupied storage locations within the CAM device or (ii) a record of CAM addresses that correspond to storage locations already occupied by the match clauses of the rules having a lower priority than the new rule.

17. The computer readable storage medium of claim 16 wherein the instructions which cause the processing entity to obtain each of the CAM addresses comprise instructions which, when executed by the processing entity, cause the processing entity to compare a CAM address from the list of CAM addresses with a CAM address from the record of CAM addresses to determine which of the CAM addresses has a higher priority.

* * * * *